US011119134B2

(12) United States Patent
Peterson et al.

(10) Patent No.: US 11,119,134 B2
(45) Date of Patent: *Sep. 14, 2021

(54) DETECTOR AND METHOD FOR MEASURING A RESISTANCE OF A VARIABLE RESISTANCE SENSOR WHOSE RESISTANCE VARIES WITH RESPECT TO A TIME-VARYING STIMULUS

(71) Applicant: Cirrus Logic International Semiconductor Ltd., Edinburgh (GB)

(72) Inventors: Cory Jay Peterson, Austin, TX (US);
Chandra B. Prakash, Austin, TX (US);
Anand Ilango, Austin, TX (US);
Ramin Zanbaghi, Austin, TX (US);
Dejun Wang, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 196 days.

This patent is subject to a terminal disclaimer.

(21) Appl. No.: 16/530,606

(22) Filed: Aug. 2, 2019

(65) Prior Publication Data

US 2021/0033654 A1   Feb. 4, 2021

(51) Int. Cl.
*G01R 27/02* (2006.01)
*H03M 1/44* (2006.01)
(Continued)

(52) U.S. Cl.
CPC ............ *G01R 27/02* (2013.01); *H03M 1/447* (2013.01); *G01K 7/22* (2013.01); *G01R 27/08* (2013.01)

(58) Field of Classification Search
CPC ........ G01R 27/00; G01R 27/02; G01R 27/08; G01R 27/14; H03M 1/00; H03M 1/06;
(Continued)

(56) References Cited

U.S. PATENT DOCUMENTS 3,875,503 A * 4/1975 Hayashi ................. G01R 27/02
324/607
4,864,513 A * 9/1989 Levine .................... G01D 5/165
702/65
(Continued)

FOREIGN PATENT DOCUMENTS

WO   WO201416834   10/2014

OTHER PUBLICATIONS

AVRFreaks.pdf; https://www.avrfreaks.net/forum/help-sensor-what%C2%B4s-ratiometrically; downloaded Mar. 13, 2019.
(Continued)

*Primary Examiner* — Hoai-An D. Nguyen
(74) *Attorney, Agent, or Firm* — E. Alan Davis; James W. Huffman (57) ABSTRACT

A detector for measuring a resistance of a variable resistance sensor (VRS) that varies with respect to a time-varying stimulus (e.g., temperature) includes a voltage reference having variation with respect to operating conditions and a linearized digital-to-analog converter (LIDAC) having a known transconductance that uses the voltage reference to generate a current for pumping into the VRS to cause the VRS to generate a voltage sensed by the detector. The sensed voltage includes error due to the variation of the voltage reference. The detector also includes a programmable gain amplifier (PGA) that gains up the sensed voltage to generate an output signal, an ADC that converts the output signal to a digital value, and a digital processor that computes the resistance of the VRS using the digital value and the known transconductance. The PGA is non-varying with respect to the time-varying stimulus.

22 Claims, 3 Drawing Sheets

(51) Int. Cl.
*G01K 7/22* (2006.01)
*G01R 27/08* (2006.01)

(58) Field of Classification Search
CPC ........ H03M 1/0617; H03M 1/12; H03M 1/34;
H03M 1/38; H03M 1/44; H03M 1/447;
H03M 1/66; H03M 1/74; H03M 1/742;
G01K 7/00; G01K 7/16; G01K 7/22;
G01K 7/24
USPC ............... 324/600, 649, 691, 713, 522, 525;
361/91.2, 93.1, 93.5, 93.7; 702/53, 127,
702/130, 133
See application file for complete search history.

(56) References Cited

U.S. PATENT DOCUMENTS

| | | | | |
|---|---|---|---|---|
| 5,172,115 | A | 12/1992 | Kerth et al. | |
| 6,037,888 | A | 3/2000 | Nairn | |
| 6,225,802 | B1 | 5/2001 | Ramalho et al. | |
| 6,625,555 | B2* | 9/2003 | Kuan | H03M 1/0619 |
| | | | | 702/107 |
| 6,741,120 | B1* | 5/2004 | Tan | H03H 11/1291 |
| | | | | 327/554 |
| 7,607,823 | B2 | 10/2009 | Kent | |
| 7,960,979 | B1* | 6/2011 | Lee | G01R 35/00 |
| | | | | 324/706 |
| 8,090,334 | B1* | 1/2012 | Yahav | H03F 3/45188 |
| | | | | 455/240.1 |
| 9,494,470 | B2 | 11/2016 | Nelson | |
| 10,460,638 | B2* | 10/2019 | Abbott | G06F 11/2221 |
| 10,826,512 | B1* | 11/2020 | Peterson | H03M 1/0619 |
| 2002/0190733 | A1* | 12/2002 | Kinoshita | G01F 1/6986 |
| | | | | 324/713 |
| 2013/0314110 | A1 | 11/2013 | McNeill et al. | |
| 2015/0091591 | A1 | 4/2015 | Charles | |
| 2015/0249434 | A1* | 9/2015 | Ogawa | G01R 27/02 |
| | | | | 73/504.02 |
| 2016/0109527 | A1* | 4/2016 | Drenkelforth | B60L 58/12 |
| | | | | 702/63 |

OTHER PUBLICATIONS

"Help with a sensor. What's ratiometrically?" AVRFreaks.pdf Downloaded on Mar. 13, 2019 from https://www.avrfreaks.net/forum/help-sensor-what%C2%B4s-ratiometrically. pp. 1-3.

* cited by examiner

DETECTOR AND METHOD FOR MEASURING A RESISTANCE OF A VARIABLE RESISTANCE SENSOR WHOSE RESISTANCE VARIES WITH RESPECT TO A TIME-VARYING STIMULUS

BACKGROUND

There are many scenarios where it is essential to accurately detect a resistance of a sensor whose resistance varies over time. For example, the resistance of a photoresistor varies according to the intensity of light to which the photoresistor is exposed. Thus, to measure light intensity using a photoresistor, an accurate detector is needed to measure its resistance with minimum error. For another example, the resistance of a pressure sensor may vary according to the amount of pressure applied to it. Thus, to measure pressure using a pressure sensor, an accurate detector is needed to measure its resistance with minimum error. For another example, a thermistor is a device that exhibits precise change in its resistance value with respect to its ambient temperature. Thus, to measure temperature using a thermistor, an accurate detector is needed to measure its resistance with minimum error. There are many scenarios where maintaining an accurate light intensity, pressure, temperature, etc. is essential for quality control, e.g., in medical, automotive, petrochemical, aerospace, consumer electronics, and other applications.

SUMMARY

In one embodiment, the present disclosure provides a detector for measuring a resistance of a variable resistance sensor (VRS), wherein the resistance of the VRS varies with respect to a time-varying stimulus, includes a voltage reference having variation with respect to operating conditions, and a linearized digital-to-analog converter (LIDAC) having a known transconductance that uses the voltage reference to generate a current for pumping into the VRS to cause the VRS to generate a voltage sensed by the detector. The sensed voltage includes error due to the variation of the voltage reference. The detector also includes a programmable gain amplifier (PGA) that gains up the sensed voltage to generate an output signal, an analog-to-digital converter (ADC) that converts the output signal to a digital value, and a digital processor that computes the resistance of the VRS using the digital value and the known transconductance.

In another embodiment, the present disclosure provides a method for measuring a resistance of a variable resistance sensor (VRS), wherein the resistance of the VRS varies with respect to a time-varying stimulus. The method includes generating a voltage reference having variation with respect to operating conditions, using, by a linearized digital-to-analog converter (LIDAC) having a known transconductance, the voltage reference to generate a current, and pumping the current into the VRS to cause the VRS to generate a sensed voltage. The sensed voltage includes error due to the variation of the voltage reference. The method also includes gaining up, by a programmable gain amplifier (PGA), the sensed voltage to generate an output signal, converting, by an analog-to-digital converter (ADC), the output signal to a digital value, and computing the resistance of the VRS using the digital value and the known transconductance.

DETAILED DESCRIPTION

Embodiments of a resistance detector with ultra-low error are described.

Figure 1:
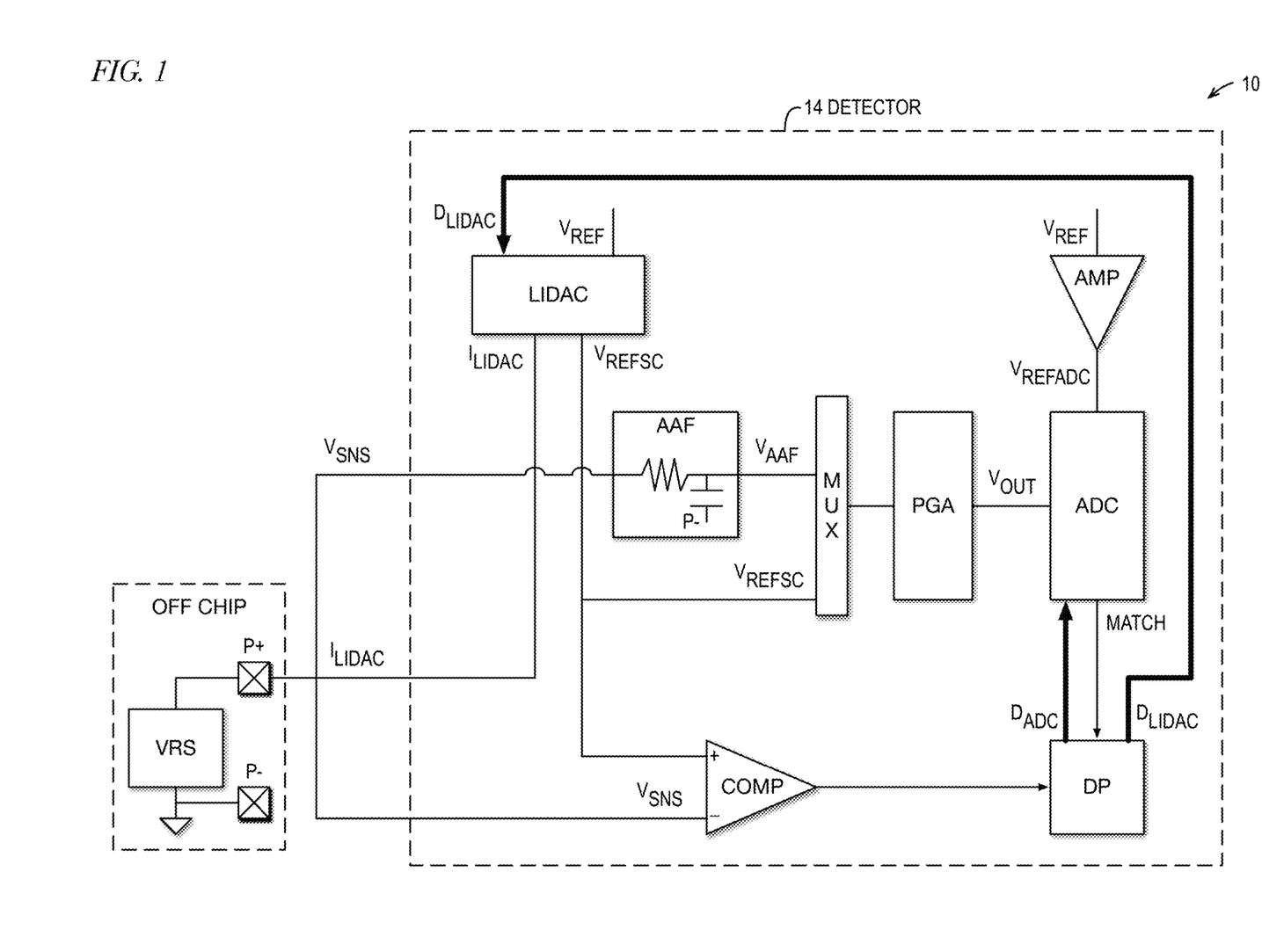
FIG. 1 is a circuit diagram illustrating an example of a system having a variable resistance sensor (VRS) and a detector for detecting the resistance of the VRS in accordance with embodiments of the present disclosure.

FIG. 1 is a circuit diagram illustrating a system 10 having a variable resistance sensor (VRS) and a detector 14 for detecting the resistance $R_{VRS}$ of the VRS in accordance with embodiments of the present disclosure. The resistance $R_{VRS}$ of the VRS varies with respect to a time-varying stimulus, e.g., temperature, pressure, voltage, light, location (e.g., location of a touch on a touchscreen), or combination thereof. The VRS may be any material or device whose resistance varies with respect to a time-varying stimulus, e.g., negative/positive temperature coefficient (NTC/PTC) resistor, photoresistor, pressure sensor, thermistor, voltage-varying resistance, touchscreen (e.g., gridded screen whose resistance varies with location on the grid of user touch). In one embodiment, the detector 14 is integrated onto one or more integrated circuits. In one embodiment, the VRS is located external to the one or more integrated circuits that comprise the detector 14, as shown in FIG. 1. Thus, the detector 14 may be employed as a remote resistance detector, e.g., remote temperature sensor. In such an embodiment, a pin may be attached at each terminal of the VRS, shown in FIG. 1 as pin P+ and pin P−. Pin P− may be connected to ground. The pins may be used to pump VRS current $I_{LIDAC}$ and sense voltage $V_{SNS}$. In an alternative embodiment, the VRS is located on the same integrated circuit that comprises the detector 14.

The detector 14 includes a linearized current digital-to-analog converter (LIDAC), an anti-aliasing filter (AAF), a programmable gain amplifier (PGA), an analog-to-digital converter (ADC), an amplifier (AMP), a comparator (COMP), and a digital processor (DP). The LIDAC generates a current $I_{LIDAC}$ that is pumped into the VRS. The current $I_{LIDAC}$ through the VRS generates a voltage $V_{SNS}$ across the VRS that is sensed by the AAF and the comparator COMP. The detector 14 uses the sensed voltage $V_{SNS}$ to detect the resistance $R_{VRS}$ of the VRS, which may vary over time with respect to the time-varying stimulus. The detected resistance may be used to calculate other quantities related to the VRS, e.g., temperature, pressure, light intensity, voltage, touch location. Advantageously, the detector 14 employs various aspects to detect the time-varying resistance $R_{VRS}$ of the VRS with high accuracy, low temperature sensitivity, relatively low chip area and power consumption.

The detector 14 generates a voltage reference $V_{REF}$. In one embodiment, voltage reference $V_{REF}$ is a bandgap voltage reference. In one embodiment, voltage reference $V_{REF}$ has a value of approximately 0.7 Volts. Amplifier AMP amplifies voltage reference $V_{REF}$ to generate an ADC voltage reference $V_{REFADC}$ used by the ADC to convert an output $V_{OUT}$ of the PGA to a digital value $D_{ADC}$. In one embodiment, the gain L of amplifier AMP is two. Amplifier AMP may have gain error and/or offset error due to operating conditions, e.g., mechanical stress, process, voltage and/or temperature variation. Therefore, amplifier AMP may introduce error in ADC voltage reference $V_{REFADC}$, which may introduce error into the digital values generated by the ADC. Advantageously, the error may be minimized by using a ratio of digital values generated by the ADC, as described in more detail below, e.g., with respect to FIG. 4.

Additionally, the LIDAC uses voltage reference $V_{REF}$ to generate a reference current $I_{REF}$ (see FIG. 2) that the LIDAC uses to generate the VRS current $I_{LIDAC}$. Because the LIDAC is linearized, a transconductance G, which is the ratio of the VRS current $I_{LIDAC}$ to the voltage reference $V_{REF}$, is known and is advantageously used to remove error that would otherwise be present in the measurement of the resistance $R_{VRS}$ of the VRS, as described in more detail below. The LIDAC also uses voltage reference $V_{REF}$ to generate a scaled voltage reference $V_{REFSC}$ that is provided to multiplexing circuitry MUX and to comparator COMP. An embodiment of the LIDAC is described in more detail below with respect to FIG. 2. Voltage reference $V_{REF}$ may also have variation due to operating conditions. The variation may introduce error into signals that use voltage reference $V_{REF}$, e.g., ADC voltage reference $V_{REFADC}$ and scaled voltage reference $V_{REFSC}$. However, embodiments of the detector 14 are described that advantageously significantly remove the error introduced by the variation to detect the resistance $R_{VRS}$ of the VSR with low error.

The AAF filters the sensed voltage $V_{SNS}$ to generate an anti-alias-filtered voltage $V_{AAF}$. In one embodiment, the AAF includes a resistor-capacitor network connected to ground at pin P− that operates as a low-pass filter on sensed voltage $V_{SNS}$. In one embodiment, the LIDAC accomplishes linearity using high-frequency switching, e.g., dynamic element matching (DEM), and the AAF advantageously attenuates the upconverted errors by the DEM and therefore improves accuracy of the sensed voltage $V_{SNS}$ signal into the desired signal band, e.g., 40 kHz range. The anti-alias-filtered voltage $V_{AAF}$ is provided as a second input to the multiplexing circuitry MUX. The output of the multiplexing circuitry MUX (i.e., either the scaled voltage reference $V_{REFSC}$ or the anti-alias-filtered voltage $V_{AAF}$) is provided to the PGA. Operation of the multiplexing circuitry MUX is described in more detail below, e.g., with respect to FIG. 3.

The PGA gains up the scaled voltage reference $V_{REFSC}$ or the anti-alias-filtered voltage $V_{AAF}$ selected by the multiplexing circuitry MUX to generate an output voltage $V_{OUT}$ that is sensed by the ADC and converted to the digital value $D_{ADC}$ using the ADC voltage reference $V_{REFADC}$. Preferably, the PGA is effectively non-varying with respect to the time-varying stimulus that varies the resistance $R_{VRS}$ of the VRS. The PGA scales up the sensed voltage $V_{SNS}$ to near the full scale of the ADC, i.e., to occupy the entire dynamic range of the ADC. This may advantageously enable use of a relatively low resolution, small and low power-consuming ADC while still providing relatively low quantization error.

The digital processor DP generates a digital current value $D_{LIDAC}$ provided as an input to the LIDAC that controls the value of the VRS current $I_{LIDAC}$ that is pumped into the VRS to generate sensed voltage $V_{SNS}$. More specifically, the digital current value $D_{LIDAC}$ is a multiplier of a unit current $I_{LSB}$ (see FIG. 2) generated within the LIDAC using the reference current $I_{REF}$ (see FIG. 2). The resistance of the VRS and therefore its sensed voltage $V_{SNS}$ may vary widely. At initialization, i.e., when the detector 14 begins being used to measure the resistance $R_{VRS}$ of the VRS, the comparator COMP compares the sensed voltage $V_{SNS}$ with scaled voltage reference $V_{REFSC}$ and provides a result of the comparison to the digital processor DP. The digital processor DP uses the result of the comparison to generate a digital current value $D_{LIDAC}$ that causes the value of sensed voltage $V_{SNS}$ (and therefore anti-alias-filtered voltage $V_{AAF}$) to be close to a target voltage, e.g., near scaled voltage reference $V_{REFSC}$. Preferably, the target voltage is kept relatively low (e.g., 0.35 Volts in one embodiment) in order to avoid self-heating effects of the VRS that may affect accuracy of the detection of its resistance. However, a low voltage input to the ADC might require a higher resolution ADC to lower error caused by quantization noise. Therefore, advantageously, the PGA scales up the target voltage, e.g., anti-alias-filtered voltage $V_{AAF}$, in order to make the most use of the dynamic range of the ADC, as described in more detail below, thereby enabling employment of a lower resolution ADC to obtain a comparable quantization error level.

In one embodiment, the ADC is a successive approximation register (SAR) ADC. The digital processor DP outputs the digital ADC value $D_{ADC}$ to the SAR ADC. The SAR ADC uses the digital ADC value $D_{ADC}$ to internally generate an analog voltage using the ADC voltage reference $V_{REFADC}$. The SAR ADC responsively generates a match indicator to the digital processor DP. The match indicator indicates whether the internally generated analog voltage matches the output voltage $V_{OUT}$, is higher than the output voltage $V_{OUT}$, or is lower than the output voltage $V_{OUT}$. In response to the match indicator, the digital processor DP successively provides different values of the digital ADC value $D_{ADC}$, preferably in a binary search fashion, until a match is indicated. The final digital ADC value $D_{ADC}$ corresponds to the digital value of the output voltage $V_{OUT}$, which is a gained-up version of either scaled voltage reference $V_{REFSC}$ or anti-alias-filtered voltage $V_{AAF}$ depending on the selection made by the multiplexing circuitry MUX.

Figure 2:
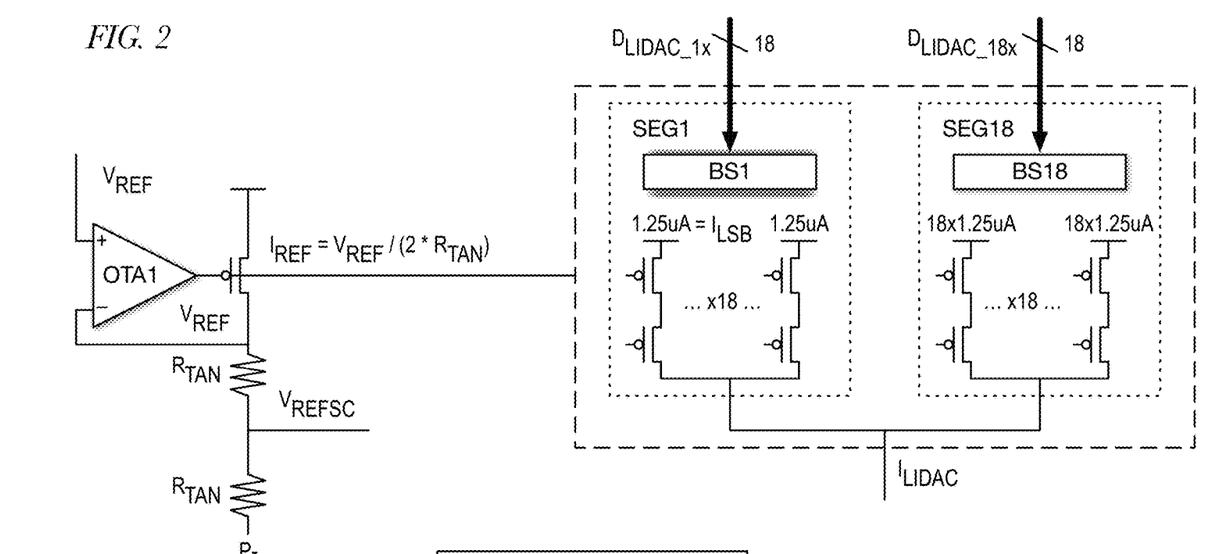
FIG. 2 is a circuit diagram illustrating an example of a linearized DAC such as the LIDAC of FIG. 1 according to embodiments of the present disclosure.

FIG. 2 is a circuit diagram illustrating a linearized DAC (e.g., LIDAC of FIG. 1) according to embodiments of the present disclosure. The LIDAC includes an operational transconductance amplifier (OTA) OTA1, a p-channel MOSFET, two series resistors of equal value $R_{TAN}$, and first and second segments SEG1 and SEG18. In one embodiment, the resistors $R_{TAN}$ are tantalum nitride resistors whose resistance is highly temperature-insensitive. The gate of the MOSFET is connected to the output of OTA1. The source of the MOSFET is connected to supply, and the drain of the MOSFET is connected to the inverting input of OTA1, which is also connected to the resistors $R_{TAN}$, which are connected to ground at pin P−. OTA1 and the MOSFET operate to generate reference current $I_{REF}$ that is provided to the LIDAC. In the embodiment of FIG. 2, the value of reference current $I_{REF}$ is equal to voltage reference $V_{REF}$ (2*$R_{TAN}$) by virtue of negative feedback action. The known scalar quantity that is the ratio of voltage reference $V_{REF}$ and scaled voltage reference $V_{REFSC}$ may be used to ratiometrically remove error from the measurements made using the ADC as described in more detail below.

The fact that the LIDAC is linearized means it has de minimis quantization error. Stated alternatively, the fact that the LIDAC is linearized means it effectively has no differential non-linearity (DNL) nor integrated non-linearity (INL). In one embodiment, DEM is used by the LIDAC to linearize the LIDAC and to remove the offset error. Furthermore, offset error and gain error may be removed through calibration (e.g., during post-silicon device-specific product test). In an alternate embodiment, the LIDAC is linearized by using data-weighted averaging.

In the embodiment of FIG. 2, segment SEG1 includes an 18-bit barrel shifter BS1 and 18 current mirrors. Each current mirror is designed to mirror reference current $I_{REF}$ by a factor of 1/W, where W is a ratio of reference current $I_{REF}$ and unit current $I_{LSB}$. In one embodiment, W is 32, $I_{REF}$ is 40 microamps, and $I_{LSB}$ is 1.25 microamps. Each of the 18 current mirrors receives a corresponding control bit from barrel shifter BS1 and generates a current with a value of unit current $I_{LSB}$ if the control bit is one and a value of zero if the control bit is zero. Segment SEG18 includes a second 18-bit barrel shifter BS18 and 18 current mirrors. Each current mirror in SEG18 is designed to mirror reference current $I_{REF}$ by a factor of 18/W and generates a current with a value of 18 times unit current $I_{LSB}$ if the control bit is one and a value of zero if the control bit is zero. The currents from the current mirrors of both segments SEG1 and SEG18 are summed together to generate VRS current $I_{LIDAC}$. In the embodiment of FIG. 2, the structure of the LIDAC enables it to generate values of VRS current $I_{LIDAC}$ from $I_{LSB}$ to 17×19=323 $I_{LSB}$, e.g., approximately 1.25 microamps to 403.75 microamps. The binary value loaded into each of the barrel shifters must include at least one bit that is not zero and at least one bit that is not one in order to accomplish the effect of canceling out process variation among the current mirrors of the segment.

Operation of the LIDAC is as follows. When the digital processor DP loads a new value of digital current value $D_{LIDAC}$ into barrel shifters BS1 and BS18 (more specifically, 18-bit $D_{LIDAC}\_1x$ into BS1 and 18-bit $D_{LIDAC}\_18x$ into BS18), the current mirrors responsively generate a value of VRS current $I_{LIDAC}$. Then the value of each of the barrel shifters BS1 and BS18 is rotated by one bit and the current mirrors responsively generate a second value of VRS current $I_{LIDAC}$. Then the value of each of the barrel shifters BS1 and BS18 is rotated by one bit and the current mirrors responsively generate a third value of VRS current $I_{LIDAC}$. This operation continues at a high frequency until all 18 bits have been rotated through the barrel shifters BS1 and BS18. In this manner, process variations in the current mirrors (e.g., size differences) are mitigated in order to minimize offset error and to provide a highly-linearized DAC with negligible quantization error. Employment of the barrel shifters BS1 and BS18 may have the advantage of reducing the size and power consumption of the LIDAC relative to a current DAC that uses hardware to randomize the inputs to the current mirrors. The AAF operates to remove any aliasing in sensed voltage $V_{SNS}$ that might be caused by the high-frequency switching operation of the LIDAC.

In the embodiment of FIG. 2, the number of DEM elements is chosen to support a resistance of the VSR in a range of about 1 kilo-Ohm to 100 kilo-Ohm. However, different numbers of DEM elements may be employed to support different ranges of resistance of the VSR. In one embodiment, the clock frequency at which the barrel shifters rotate is 12 MHz, which tends to generate tones at about 700 kHz given the number of DEM elements. The tones are filtered by the AAF (e.g., approximately 26 dB attenuation), and the averaging performed by operation of the barrel shifting may provide another approximately 12.5 dB (e.g., $10*\log_{10}(18)$) of rejection.

Figure 3:
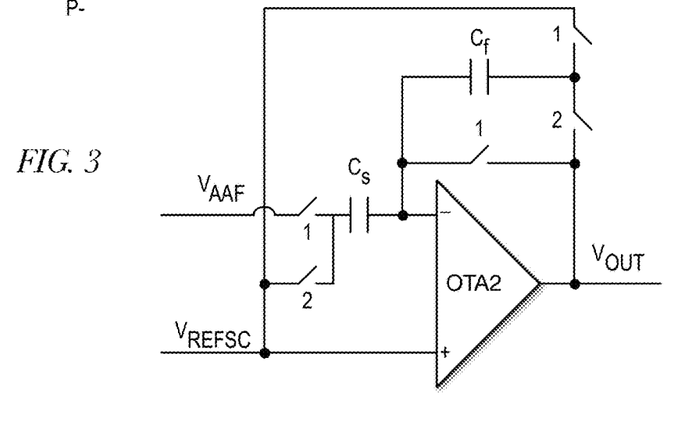
FIG. 3 is a circuit diagram illustrating an example of a dual-input programmable gain amplifier PGA according to embodiments of the present disclosure.

FIG. 3 is a circuit diagram illustrating a dual-input programmable gain amplifier PGA according to embodiments of the present disclosure. The circuit of FIG. 3 may perform the function of the multiplexing circuitry MUX and PGA of FIG. 1, for example. The PGA includes an operational transconductance amplifier OTA2, a sampling capacitor $C_s$, a feedback capacitor $C_f$, and five switches that operate with sampling capacitor $C_s$ and feedback capacitor $C_f$ as a switched capacitor network that automatically cancels any offset of the PGA. Each of the five switches is labelled with a "1" or a "2" to indicate whether it is closed by a respective first or second phase of a clock signal, and the switches are referred to as a switch 1 or a switch 2. The non-inverting input of OTA2 receives scaled voltage reference $V_{REFSC}$. OTA2 uses negative feedback to generate output voltage $V_{OUT}$ of the PGA. A first switch 1 is connected across the output of the PGA and the inverting input of the PGA in parallel with feedback capacitor $C_f$, although a first switch 2 is connected between feedback capacitor $C_f$ and the output side of the first switch 1. Scaled voltage reference $V_{REFSC}$ is connected to the output side of feedback capacitor $C_f$ by a second switch 1. The sampling capacitor $C_s$ is connected to the inverting input of OTA2. The other side of sampling capacitor $C_s$ is connected to a second switch 2 that selectively connects the sampling capacitor $C_s$ to scaled voltage reference $V_{REFSC}$. The other side of sampling capacitor $C_s$ is also connected to a third switch 1 that selectively connects the sampling capacitor $C_s$ to anti-alias-filtered voltage $V_{AAF}$. Thus, the second switch 2 and third switch 1 operate to provide a multiplexing capability to select either anti-alias-filtered voltage $V_{AAF}$ or scaled voltage reference $V_{REFSC}$ as an input. The gain M of the PGA is the ratio of the capacitances of sampling capacitor $C_s$ and feedback capacitor $C_f$. The PGA is highly resistant to error caused by gain variation because its gain M is defined by a ratio of scaled components, e.g., sampling capacitor $C_s$ and feedback capacitor $C_f$, which makes it highly insensitive to temperature, voltage and process variation. In an alternate embodiment, the gain M is defined by scaled resistors. The PGA scales up the anti-alias-filtered sensed voltage $V_{SNS}$ to maximize the dynamic range of the ADC. As described above, the PGA may have minimal offset due to operation of the offset cancelled switched capacitor network.

Figure 4:
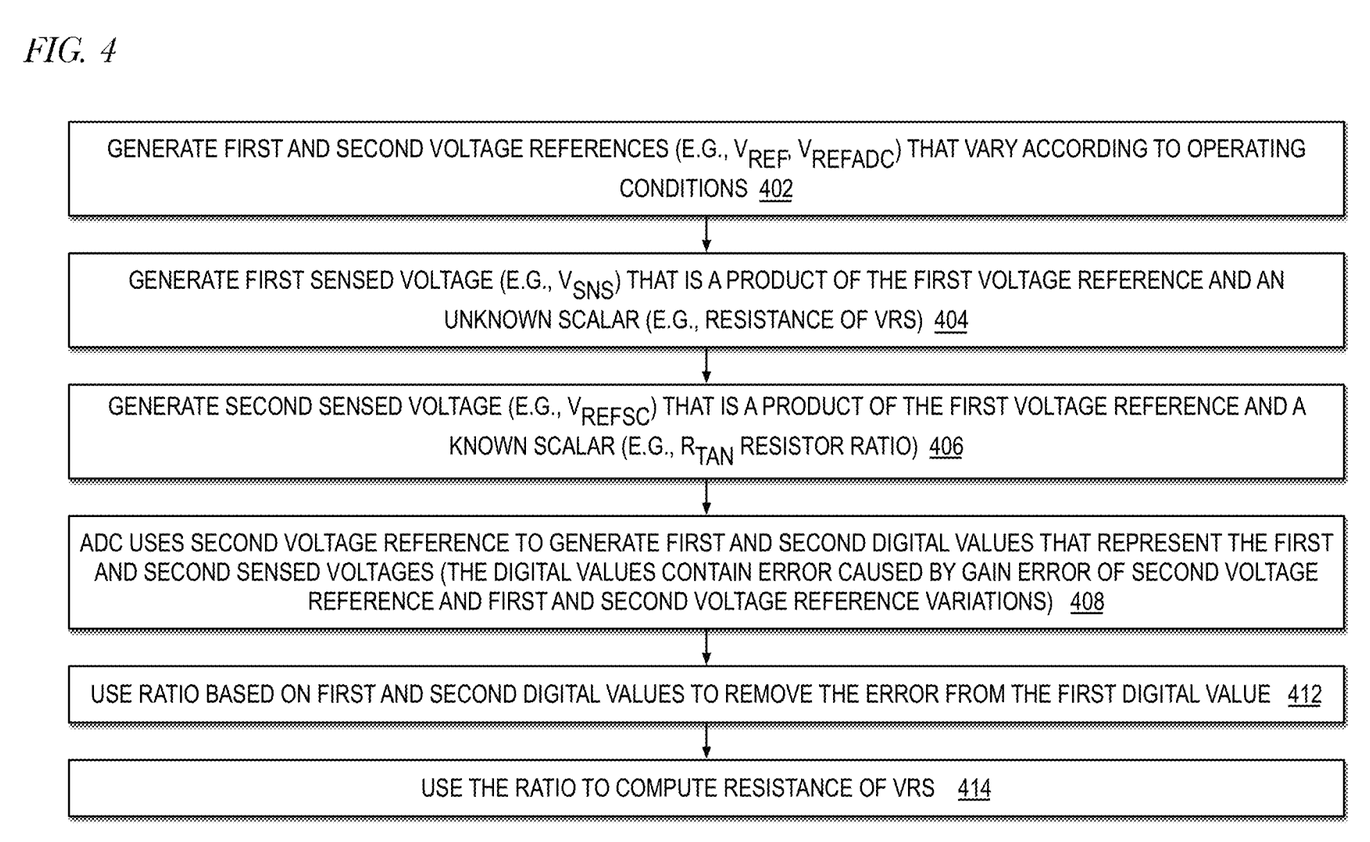
FIG. 4 is a flowchart illustrating an example of a method for removing error in a digital output generated by an ADC system such as the detector of FIG. 1 according to embodiments of the present disclosure.

FIG. 4 is a flowchart illustrating a method for removing error in a digital output generated by an ADC system (e.g., detector 14 of FIG. 1) according to embodiments of the present disclosure. Operation begins at block 402.

At block 402, first and second voltage references are generated, e.g., voltage reference $V_{REF}$ and ADC voltage reference $V_{REFADC}$. The first and second voltage references include variation with respect to their respective operating conditions, e.g., mechanical stress, process, voltage and/or temperature variation. Consequently, error may be introduced into signals that involve the first and second reference voltages. In one embodiment, the second voltage reference is a scaled version of the first voltage reference, e.g., ADC voltage reference $V_{REFADC}$ is a scalar multiple of voltage reference $V_{REF}$ in which the scalar is the gain L of amplifier AMP of FIG. 1. In another embodiment, the second voltage reference is the first voltage reference. Operation proceeds to block 404.

At block 404, a first sensed voltage is generated that is a product of the first voltage reference and an unknown scalar, e.g., sensed voltage $V_{SNS}$, or anti-alias-filtered voltage $V_{AAF}$, or the output voltage $V_{OUT}$ that is the gained-up version of anti-alias-filtered voltage $V_{AAF}$. The sensed voltage $V_{SNS}$ may be understood as the product of voltage reference $V_{REF}$ and an unknown scalar. The unknown scalar may be the product resistance $R_{VRS}$ of the VRS, which is unknown, and the transconductance of detector 14. Operation proceeds to block 406.

At block 406, a second sensed voltage is generated that is a product of the first voltage reference and a known scalar, e.g., scaled voltage reference $V_{REFSC}$, or the output voltage $V_{OUT}$ that is the gained-up version of scaled voltage reference $V_{REFSC}$. The scaled voltage reference $V_{REFSC}$ may be understood as the product of voltage reference $V_{REF}$ and a known scalar. The known scalar may be, in the embodiment of FIG. 2, the voltage divider ratio accomplished by the two $R_{TAN}$ resistors (e.g., one-half). Operation proceeds to block 408.

At block 408, the ADC uses the second voltage reference (e.g., scaled voltage reference $V_{REFSC}$) to generate a first digital value that represent the first sensed voltage and to generate a second digital value that represent the second sensed voltage. The first and second digital values may contain error as a result of the gain error of the second voltage reference. The first and second digital values may also contain error as a result of the variation of the first and second voltage references. Operation proceeds to block 412.

At block 412, a ratio based on the first and second digital values is used (e.g., by the digital processor DP) to remove the error from the first digital value. Various ratios based on the first and second digital values and their use are described in more detail below. Operation proceeds to block 414.

At block 414, the ratio computed at block 412 is used to compute the resistance of the VRS.

The operation described in FIG. 4 may be further described according to the following equations. In equation (1) below, $V_{SENSE1}$ is the first sensed voltage of block 404, $V_{REF1}$ is the first voltage reference of block 402, and U is the unknown scalar of block 404. In equation (2) below, $V_{SENSE2}$ is the second sensed voltage of block 406, and K is the known scalar of block 406.

$$V_{SENSE1} = U * V_{REF1} \quad (1)$$

$$V_{SENSE2} = K * V_{REF1} \quad (2)$$

Assume $V_{REF1}$ has variation with respect to its operating conditions. In that case, error may be introduced into the two sensed voltages such that equations (1) and (2) may be expressed as equations (3) and (4)

$$V_{SENSE1} = U * V_{REF1} * (1 + \Delta err1) \quad (3)$$

$$V_{SENSE2} = K * V_{REF1} * (1 + \Delta err1) \quad (4)$$

where $\Delta err1$ is the error introduced by the variation in $V_{REF1}$ with respect to its operating conditions.

An ADC system, such as included in detector 14, uses the second voltage reference $V_{REF2}$ that is gained up. The second voltage reference $V_{REF2}$ is assumed to have variation with respect to its operating conditions and the second voltage reference $V_{REF2}$ is assumed to have gain error, e.g., amplifier AMP of FIG. 1 has gain error and offset error induced by temperature variation (or other operating conditions) that introduce error into ADC voltage reference $V_{REFADC}$. In that case, when the ADC converts the two sensed voltages to respective digital values, error may be introduced into the two digital values as expressed essentially in equations (5) and (6)

$$D_1 = U * V_{REF1} * (1 + \Delta err1) * (1 + \Delta err2) * (1 + \Delta err3) \quad (5)$$

$$D_2 = K * V_{REF1} * (1 + \Delta err1) * (1 + \Delta err2) * (1 + \Delta err3) \quad (6)$$

where $\Delta err2$ is the error introduced by the variation in $V_{REF2}$ with respect to its operating conditions, and $\Delta err3$ is the gain error.

As may be observed, taking the ratio of the two digital values $D_1$ and $D_2$ given by equations (5) and (6) cancels the error factors to yield a ratio of the unknown scalar U and the known scalar K, per equation (7).

$$\frac{D_1}{D_2} = \frac{U}{K} \quad (7)$$

Because the error is essentially canceled, the ratio of the two digital values may be expressed by equation (8)

$$\frac{D_1}{D_2} = \frac{V_{SENSE1\_IDEAL}}{V_{SENSE2\_IDEAL}} \quad (8)$$

where $V_{SENSE1\_IDEAL}$ and $V_{SENSE2\_IDEAL}$ are the respective values of first and second sensed voltages without error caused by variation in $V_{REF1}$ or $V_{REF2}$ or gain error caused by a circuit element that added gain to generate $V_{REF2}$. Furthermore, the unknown scalar U may be solved per equation (9).

$$U = K * \frac{D_1}{D_2} \quad (9)$$

Taking the embodiment of FIG. 2, the relationship between voltage reference $V_{REF}$ and scaled voltage reference $V_{REF}$ SC may be expressed per equation (10).

$$V_{REFSC} = \frac{R_{TAN}}{R_{TAN} + R_{TAN}} * V_{REF} = \frac{1}{2} V_{REF} \quad (10)$$

Taking scaled voltage reference $V_{REFSC}$ as $V_{SENSE2}$ and voltage reference $V_{REF}$ as $V_{REF1}$ of equation (2), yields the known scalar K per equation (11).

$$K = \frac{R_{TAN}}{R_{TAN} + R_{TAN}} = \frac{1}{2} \quad (11)$$

Take $V_{SENSE1}$ of equation (1) as a sensed voltage across a variable-resistance sensor whose resistance varies with respect to a time-varying stimulus, such as $V_{SNS}$ of detector 14, and take $V_{REF1}$ of equation (1) as $V_{REF}$ of detector 14 such that $V_{SNS}$ is a product of $V_{REF}$ and an unknown scalar U per equation (12).

$$V_{SNS} = U * V_{REF} \quad (12)$$

Sensed voltage $V_{SNS}$ is given by equation (13).

$$V_{SNS} = R_{VRS} * I_{LIDAC} \quad (13)$$

VRS current $I_{LIDAC}$ is given by equation (14).

$$I_{LIDAC} = D_{LIDAC} * I_{LSB} \quad (14)$$

Reference current $I_{REF}$ is given by equation (15).

$$I_{REF} = \frac{V_{REF}}{2 * R_{TAN}} \quad (15)$$

Unit current $I_{LSB}$ is given by equation (16).

$$I_{LSB} = \frac{I_{REF}}{W} \quad (16)$$

where W is the known ratio of $I_{REF}$ and the $I_{LSB}$ according to the sizing of the current mirrors of the LIDAC, which is known (e.g., which is 32 in the embodiment of FIG. 2).

Combining equations (12) through (16) yields an expression for U in equation (17).

$$U = R_{VRS} * \frac{D_{LIDAC}}{W * 2 * R_{TAN}} \quad (17)$$

By combining equations (9), (11) and (17), the unknown resistance $R_{VRS}$ of the VRS may be solved using the ratio of the two digital values $D_1$ and $D_2$ by equation (18).

$$R_{VRS} = \frac{D_1}{D_2} * \frac{W * R_{TAN}}{D_{LIDAC}} \quad (18)$$

In the above analysis, it was assumed that the gain M of the PGA is one and the common mode voltage of the PGA is zero. Now take the embodiment of FIG. 3 in which the common mode voltage of the PGA is scaled voltage reference $V_{REFSC}$ and the gain of the PGA is M (e.g., 2 in one embodiment). The two digital values $D_1$ and $D_2$ may then be expressed by equations (19) and (20).

$$D_1 = [V_{REFSC}*(1+\Delta err1) + M(V_{SNS}*(1+\Delta err1) - V_{REFSC}* (1+\Delta err1))]*(1+\Delta err2)*(1+\Delta err3) \quad (19)$$

$$D_2 = [V_{REFSC}*(1+\Delta err1) + M(V_{REFSC}*(1+\Delta err1) - V_{REFSC}*(1+\Delta err1))]*(1+\Delta err2)*(1+\Delta err3) \quad (20)$$

Taking the ratio of $D_1$ and $D_2$ given by equations (19) and (20) and solving for sensed voltage $V_{SNS}$ yields equation (21) in which the error terms are effectively eliminated.

$$V_{SNS} = V_{REFSC} * \frac{D_1 + D_2(M-1)}{M * D_2} \quad (21)$$

Combining equation (21) with equation (14) and solving for resistance $R_{VRS}$ of the VRS yields equation (22).

$$R_{VRS} = \frac{1}{D_{LIDAC}} * \frac{V_{REFSC}}{I_{LSB}} * \frac{D_1 + D_2(M-1)}{M * D_2} \quad (22)$$

Let the second term of equation (22) be designated as the unit resistance R[1] of the LIDAC per equation (23), e.g., where the value of digital current value $D_{LIDAC}$ is one.

$$R[1] = \frac{V_{REFSC}}{LSB} \quad (23)$$

Further, let the product of the first and second terms of equation (22) be designated as a non-unit resistance R[D] of the LIDAC per equation (24), where R[D] is the resistance for a given value D of digital current value $D_{LIDAC}$.

$$R[D] = \frac{1}{D_{LIDAC}} * \frac{V_{REFSC}}{I_{LSB}} \quad (24)$$

Thus, if the resistance R[D] for a given VRS current $I_{LIDAC}$ stimulated by a digital current value $D_{LIDAC}$ is known, then the resistance $R_{VRS}$ of the VRS may be determined according to equation (22), e.g., by digital processor DP. In one embodiment, the unit resistance R[1] and non-unit resistance R[D] may be computed using equations (25) and (26), which are derived from equations (23), (24), (10), (15) and (16).

$$R[1] = R_{TAN} * W \quad (25)$$

$$R[D] = \frac{1}{D_{LIDAC}} * R[1] \quad (26)$$

However, in an alternate embodiment, the unit resistance R[1] may be determined at calibration time (e.g., during post-silicon device-specific product test) by inputting a unit digital current value $D_{LIDAC}$, measuring the VRS current $I_{LIDAC}$ while simultaneously measuring the scaled voltage reference $V_{REFSC}$ (e.g., at pins P+ and P−), and substituting the measured values into equation (23). Similarly, the non-unit resistance R[D] may be determined at a calibration time by inputting different non-unit D digital current values $D_{LIDAC}$, measuring the VRS current $I_{LIDAC}$ while simultaneously measuring the scaled voltage reference $V_{REFSC}$, and substituting the measured values into equation (24). In one embodiment, such a procedure may be performed for each segment of the LIDAC. In one embodiment, measurements may be taken at minimum and maximum values of digital current value $D_{LIDAC}$ and intermediate values of R[D] may be linearly interpolated from the minimum and maximum values. In one embodiment, a crossbar switch may precede OTA1 of FIG. 2 to enable its inputs to be toggled, and during calibration time scaled voltage reference $V_{REFSC}$ is measured twice—once at each configuration of the crossbar switch—and the two values are averaged to minimize effects of OTA1 offset error. Such an embodiment may be susceptible to mismatch in the $R_{TAN}$ resistors, which susceptibility may be minimized by careful sizing and calibration of the $R_{TAN}$ resistors. Such an embodiment may also be susceptible to variation in the $R_{TAN}$ resistors due to operating conditions. In one embodiment, an internal temperature sensor may be included in the detector 14 to compensate for variation in the temperature coefficient of resistance (TCR) of the $R_{TAN}$ resistors. In yet another embodiment, the $R_{TAN}$ resistors may be replaced by an external precision resistor.

Various advantages may be obtained by using the ratio based on the first and second digital values $D_1$ and $D_2$. First, the determination of resistance $R_{VRS}$ of the VRS is independent of variation of scaled voltage reference $V_{REFSC}$. The independence may be observed from the second term of equation (22) because it involves a ratio of scaled voltage reference $V_{REFSC}$ and unit current $I_{LSB}$. Unit current $I_{LSB}$ is generated from reference current $I_{REF}$ (by the linearized DAC) which is generated from scaled voltage reference $V_{REFSC}$. Thus, by knowing the unit resistance R[1], variation in scaled voltage reference $V_{REFSC}$ is eliminated in the determination of resistance $R_{VRS}$ of the VRS by using the ratio based on the first and second digital values $D_1$ and $D_2$, e.g., the third term of equation (22), as well as equation (18). Second, the determination of resistance $R_{VRS}$ of the VRS is independent of variation of ADC voltage reference $V_{REFADC}$ because gain error and offset error of amplifier AMP and error introduced to amplifier AMP by variation in voltage reference $V_{REF}$, are eliminated by using the ratio based on the first and second digital values $D_1$ and $D_2$, e.g., the third term of equation (22), as described above with respect to equations (19) through (21), as well as equation (18). Third, the determination of resistance $R_{VRS}$ of the VRS is independent of variation of offset error in the LIDAC which is removed by the DEM. As may be observed from equation (22), variation in the gain M of the PGA may affect accuracy of the determination of resistance $R_{VRS}$ of the VRS. Preferably, the PGA is calibrated to minimize any gain error it may have. Furthermore, as described above, the embodiment of the PGA of FIG. 3 is highly resistant to error caused by gain variation because its gain M is defined by a ratio of scaled components, e.g., sampling capacitor $C_s$ and feedback capacitor $C_f$.

Viewing the LIDAC effectively as a transconductor that receives voltage reference $V_{REF}$ as an input and generates VRS current $I_{LIDAC}$ as an output, the non-unit transconductance G[D] of the LIDAC may be expressed by equation (27), and the unit transconductance G[1] of the LIDAC may be expressed by equation (28).

$$G[D] = \frac{I_{LIDAC}}{V_{REF}} = \frac{D_{LIDAC} * I_{LSB}}{2 * V_{REFSC}} = \frac{1}{2 * R[D]} \tag{27}$$

$$G[1] = \frac{1}{2 * R[1]} \tag{28}$$

In an embodiment in which the common mode voltage $V_{CM}$ of the PGA is a different value than the scaled voltage reference $V_{REFSC}$, a third digital value $D_3$ may be measured while the input to the PGA is the common mode voltage $V_CM$ (e.g., the differential input to OTA2 is zero). The three digital values $D_1$ and $D_2$ may then be expressed by equations (29), (30) and (31).

$$D_1=[V_{CM}*(1+\Delta err1)+M(V_{SNS}*(1+\Delta err1)-V_{CM}*(1+\Delta err1))]*(1+\Delta err2)*(1+\Delta err3) \tag{29}$$

$$D_2=[V_{CM}*(1+\Delta err1)+M(V_{REFSC}*(1+\Delta err1)-V_{CM}*(1+\Delta err1))]*(1+\Delta err2)*(1+\Delta err3) \tag{30}$$

$$D_3=[V_{CM}*(1+\Delta err1)+M(V_{CM}*(1+\Delta err1)-V_{CM}*(1+\Delta err1))]*(1+\Delta err2)*(1+\Delta err3) \tag{31}$$

Equations (29) through (31) may be simplified as equations (32) through (34).

$$D_1=[V_{CM}*(1+\Delta err1)*(1-M)+M*V_{SNS}*(1+\Delta err1)]*(1+\Delta err2)*(1+\Delta err3) \tag{32}$$

$$D_2=[V_{CM}*(1+\Delta err1)*(1-M)+M*V_{REFSC}*(1+\Delta err1)]*(1+\Delta err2)*(1+\Delta err3) \tag{33}$$

$$D_3=V_{CM}*(1+\Delta err1)*(1+\Delta err2)*(1+\Delta err3) \tag{34}$$

Equations (35) and (36) may be derived from equations (33) and (34).

$$D_1-(1-M)*D3=M*V_{SNS}*(1+\Delta err1)*(1+\Delta err2)*(1+\Delta err3) \tag{35}$$

$$D_2-(1-M)*D3=M*V_{REFSC}*(1+\Delta err1)*(1+\Delta err2)*(1+\Delta err3) \tag{36}$$

Dividing equations (35) and (36) and solving for $V_{SNS}$ yields equation (37), which is analogous to equation (21) above. Substituting with equations (13) and (14) yields the resistance $R_{VRS}$ of the VRS, which may be determined per equation (38).

$$V_{SNS} = V_{REFSC} * \frac{D_1 + D_3(M-1)}{D_2 + D_3(M-1)} \tag{37}$$

$$R_{VRS} = \frac{1}{D_{LIDAC}} * \frac{V_{REFSC}}{I_{LSB}} * \frac{D_1 + D_3(M-1)}{D_2 + D_3(M-1)} \tag{38}$$

Again, error introduced by variation in scaled voltage reference $V_{REFSC}$ is advantageously eliminated by using the ratio based on the first, second and third digital values $D_1$, $D_2$, and $D_3$, i.e., the third term of equation (38).

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

The invention claimed is:

1. A detector for measuring a resistance of a variable resistance sensor (VRS), wherein the resistance of the VRS varies with respect to a time-varying stimulus, comprising:
    a voltage reference having variation with respect to operating conditions;
    a linearized digital-to-analog converter (LIDAC) having a known transconductance that uses the voltage reference to generate a current for pumping into the VRS to cause the VRS to generate a voltage sensed by the detector;
    wherein the sensed voltage includes error due to the variation of the voltage reference;
    a programmable gain amplifier (PGA) that gains up a difference of the sensed voltage and the voltage reference to generate an output signal;
    an analog-to-digital converter (ADC) that converts the output signal to a first digital value in a first step and that converts the voltage reference to a second digital value in a second step; and
    a digital processor that computes the resistance of the VRS using the first and second digital values and the known transconductance.

2. The detector of claim 1,
    wherein the PGA is non-varying with respect to the time-varying stimulus.

3. The detector of claim 1,
    wherein the ADC uses a scaled version of the voltage reference used by the LIDAC to convert the output signal to the first and second digital values.

4. The detector of claim 1,
    wherein the time-varying stimulus is a temperature of the VRS.

5. The detector of claim 1,
    wherein the VRS is from the list:
        a photoresistor whose resistance varies with light intensity;
        a touchscreen whose resistance varies with a touched coordinate location;
        a pressure sensor whose resistance varies with pressure; and
        a sensor whose resistance varies with voltage.

6. The detector of claim 1,
    wherein the LIDAC:
        (1) is linearized by using dynamic element matching (DEM) or data-weighted averaging;
        (2) is calibrated to generate a value of the current to cause the VRS to initially generate a value of the sensed voltage that is close to a target voltage that is a common mode voltage of the PGA; or
        (3) comprises a non-variable resistance element (NVRE) used to generate the current using the voltage reference, and the NVRE is non-varying with respect to the time-varying stimulus that causes the resistance of the VRS to vary.

7. The detector of claim 1,
    wherein the LIDAC comprises:
        a first segment of N equally-weighted binary-controlled current mirrors;
        a first barrel shifter that receives a first N-bit input value and provides the first N-bit input value in a rotated fashion over a period to respective ones of the first segment of N equally-weighted binary-controlled current mirrors;
        wherein the N bits of the first input value include at least one zero-valued bit and at least one one-valued bit;
        a second segment of N equally-weighted binary-controlled current mirrors;
        a second barrel shifter that receives a second N-bit input value and provides the second N-bit input value in a rotated fashion over the period to respective ones of the second segment of N equally-weighted binary-controlled current mirrors;
        wherein the current mirrors of the first and second segments are differently weighted;
        wherein the N bits of the second input value include at least one zero-valued bit and at least one one-valued bit; and
    wherein outputs of all of the current mirrors of the first and second segments are summed together to generate the current for pumping into the VRS.

8. The detector of claim 1, further comprising:
    an anti-aliasing filter that reduces noise in the sensed voltage for provision to the PGA.

9. The detector of claim 1,
    wherein the PGA uses a scaled version of the voltage reference to gain up the sensed voltage to generate the output signal.

10. The detector of claim 1,
    wherein the PGA selectively receives the sensed voltage and a scaled version of the voltage reference;
    wherein the ADC also converts the scaled version of the voltage reference to the second digital value; and
    wherein the digital processor computes the resistance of the VRS using one of:
        a ratio that includes the first digital value and the second digital value;
        a known gain of the PGA; or
        a known digital input value to the LIDAC that controls the current generated by the LIDAC.

11. The detector of claim 10,
    wherein the digital processor computes the resistance of the VRS as a product of:
        the ratio that includes the first and second digital values;
        a reciprocal of the digital input value to the LIDAC; and
        a ratio of:
            a one-time measurement of the voltage reference; and
            a one-time measurement of a unit current of the LIDAC;
    or:
        wherein the PGA further generates a zero-input signal output voltage; and
        wherein the ratio further includes a third digital value that is the zero-input signal output voltage converted by the ADC.

12. A method for measuring a resistance of a variable resistance sensor (VRS), wherein the resistance of the VRS varies with respect to a time-varying stimulus, comprising:
    generating a voltage reference having variation with respect to operating conditions;
    using, by a linearized digital-to-analog converter (LIDAC) having a known transconductance, the voltage reference to generate a current;
    pumping the current into the VRS to cause the VRS to generate a sensed voltage;
    wherein the sensed voltage includes error due to the variation of the voltage reference;

gaining up, by a programmable gain amplifier (PGA), a difference of the sensed voltage and the voltage reference to generate an output signal;
converting, by an analog-to-digital converter (ADC), the output signal to a first digital value in a first step;
converting, by the ADC, the voltage reference to a second digital value in a second step; and
computing the resistance of the VRS using the first and second digital value values and the known transconductance.

13. The method of claim 12,
wherein the PGA is non-varying with respect to the time-varying stimulus.

14. The method of claim 12, further comprising:
wherein the ADC uses a scaled version of the voltage reference used by the LIDAC to convert the output signal to the first and second digital values.

15. The method of claim 12,
wherein the time-varying stimulus is a temperature of the VRS.

16. The method of claim 12,
wherein the VRS is from the list:
 a photoresistor whose resistance varies with light intensity;
 a touchscreen whose resistance varies with a touched coordinate location;
 a pressure sensor whose resistance varies with pressure; and
 a sensor whose resistance varies with voltage.

17. The method of claim 12,
(1) wherein the LIDAC is linearized by using dynamic element matching (DEM) or data-weighted averaging;
(2) the method further comprises calibrating the LIDAC to generate a value of the current to cause the VRS to initially generate a value of the sensed voltage that is close to a target voltage that is a common mode voltage of the PGA; or
(3) wherein the LIDAC comprises a non-variable resistance element (NVRE) used to generate the current using the voltage reference, and the NVRE is non-varying with respect to the time-varying stimulus that causes the resistance of the VRS to vary.

18. The method of claim 12,
wherein said using, by the LIDAC, the voltage reference to generate the current comprises:
 receiving, by a first barrel shifter, a first N-bit input value;
 providing, by the first barrel shifter, the first N-bit input value in a rotated fashion over a period to respective ones of a first segment of N equally-weighted binary-controlled current mirrors; and
 wherein the N bits of the first input value include at least one zero-valued bit and at least one one-valued bit; and wherein said using, by the LIDAC, the voltage reference to generate the current further comprises:
 receiving, by a second barrel shifter, a second N-bit input value;
 providing, by the second barrel shifter, the second N-bit input value in a rotated fashion over the period to respective ones of a second segment of N equally-weighted binary-controlled current mirrors;
 wherein the current mirrors of the first and second segments are differently weighted;
 wherein the N bits of the second input value include at least one zero-valued bit and at least one one-valued bit; and
 summing together outputs of all of the current mirrors of the first and second segments to generate the current for pumping into the VRS.

19. The method of claim 12, further comprising:
reducing, by an anti-aliasing filter, noise in the sensed voltage for provision to the PGA.

20. The method of claim 12, further comprising:
using, by the PGA, a scaled version of the voltage reference to gain up the sensed voltage to generate the output signal.

21. The method of claim 12, further comprising:
selectively receiving, by the PGA, the sensed voltage and a scaled version of the voltage reference;
converting, by the ADC, the scaled version of the voltage reference to a second digital value; and
computing the resistance of the VRS using one of:
 a ratio that includes the first digital value and the second digital value;
 a known gain of the PGA; or
 a known digital input value to the LIDAC that controls the current generated by the LIDAC.

22. The method of claim 21, further comprising:
computing the resistance of the VRS as a product of:
 the ratio that includes the first and second digital values;
 a reciprocal of the digital input value to the LIDAC; and
 a ratio of:
  a one-time measurement of the voltage reference; and
  a one-time measurement of a unit current of the LIDAC;
or:
 generating, by the PGA, a zero-input signal output voltage; and
 wherein the ratio further includes a third digital value that is the zero-input signal output voltage converted by the ADC.

* * * * *

UNITED STATES PATENT AND TRADEMARK OFFICE
CERTIFICATE OF CORRECTION

PATENT NO. : 11,119,134 B2  
APPLICATION NO. : 16/530606  
DATED : September 14, 2021  
INVENTOR(S) : Peterson et al.

It is certified that error appears in the above-identified patent and that said Letters Patent is hereby corrected as shown below:

In the Claims

In Column 15, Line 9, in Claim 12, delete "second digital value values" and insert -- second digital values --, therefor.

Signed and Sealed this  
Second Day of November, 2021

Drew Hirshfeld  
*Performing the Functions and Duties of the*  
*Under Secretary of Commerce for Intellectual Property and*  
*Director of the United States Patent and Trademark Office*